(12) United States Patent
Sano et al.

(10) Patent No.: US 11,056,423 B2
(45) Date of Patent: Jul. 6, 2021

(54) SEMICONDUCTOR DEVICE

(71) Applicant: Murata Manufacturing Co., Ltd., Kyoto (JP)

(72) Inventors: Yuichi Sano, Kyoto (JP); Atsushi Kurokawa, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/411,357

(22) Filed: May 14, 2019

(65) Prior Publication Data

US 2019/0363042 A1    Nov. 28, 2019

(30) Foreign Application Priority Data

May 22, 2018    (JP) .............................. JP2018-097795

(51) Int. Cl.
*H01L 23/498*    (2006.01)
*H01L 23/538*    (2006.01)
(Continued)

(52) U.S. Cl.
CPC ........ *H01L 23/49805* (2013.01); *H01L 23/34* (2013.01); *H01L 23/367* (2013.01);
(Continued)

(58) Field of Classification Search
CPC ................. H01L 24/97; H01L 2224/97; H01L 2225/1041; H01L 29/0817; H01L 2924/13051; H01L 2225/107; H01L 23/12; H01L 23/13; H01L 23/32; H01L 23/48; H01L 23/4952; H01L 23/49589;
(Continued)

(56) References Cited

U.S. PATENT DOCUMENTS 7,598,618 B2 *   10/2009  Shiraishi ........... H01L 21/76898
                                                    257/686
7,612,450 B2 *   11/2009  Lee ....................... H01L 21/563
                                                    257/738
(Continued)

FOREIGN PATENT DOCUMENTS

JP          2606110 B2     4/1997
JP          3176028 B2     6/2001
(Continued)

*Primary Examiner* — Eduardo A Rodela
(74) *Attorney, Agent, or Firm* — Pearne & Gordon LLP

(57) ABSTRACT

A semiconductor device includes a semiconductor chip mounted to a mounting substrate with an interposer interposed therebetween such that a surface of the semiconductor chip on which bumps are formed faces a surface of the mounting substrate. The mounting substrate has a plurality of metal parts formed as terminals on a surface of the mounting substrate and in contact with electrode pads connected to multilayer wiring. The semiconductor chip has a plurality of functional elements formed in an inner layer and a plurality of bumps formed in contact with element wiring lines of the functional elements such that the bumps protrude from the surface of the semiconductor chip. The interposer has a plurality of first recesses formed in the surface of the interposer facing the surface of the semiconductor chip on which the bumps are formed such that the first recesses accommodate only the bumps.

20 Claims, 8 Drawing Sheets

(51) Int. Cl.
*H01L 23/367* (2006.01)
*H01L 23/00* (2006.01)
*H01L 23/34* (2006.01)

(52) U.S. Cl.
CPC .. *H01L 23/49816* (2013.01); *H01L 23/49833* (2013.01); *H01L 23/49838* (2013.01); *H01L 23/5383* (2013.01); *H01L 24/97* (2013.01)

(58) Field of Classification Search
CPC ......... H01L 23/49822; H01L 23/49827; H01L 23/49833; H01L 23/49838; H01L 23/58; H01L 23/49816; H01L 23/5383; H01L 23/367; H01L 2224/16225; H01L 23/49805; H01L 23/49811; H01L 23/3677
See application file for complete search history.

(56) References Cited

U.S. PATENT DOCUMENTS

| | | | | |
|---|---|---|---|---|
| 8,913,402 | B1 * | 12/2014 | Berg | H01L 21/76898 361/804 |
| 9,343,419 | B2 * | 5/2016 | Yu | H01L 24/17 |
| 9,665,122 | B2 * | 5/2017 | Kwon | G06F 1/1601 |
| 9,691,745 | B2 * | 6/2017 | Hu | H01L 25/50 |
| 9,966,300 | B1 * | 5/2018 | Kelly | H01L 23/147 |
| 10,062,683 | B1 * | 8/2018 | Yang | H01L 29/732 |
| 2001/0053567 | A1 * | 12/2001 | Akram | G01R 1/0483 438/127 |
| 2003/0164551 | A1 * | 9/2003 | Lee | H01L 23/5387 257/778 |
| 2010/0283140 | A1 * | 11/2010 | Kim | H01L 23/49811 257/686 |
| 2010/0327465 | A1 * | 12/2010 | Shen | H01L 23/3135 257/778 |
| 2011/0254160 | A1 * | 10/2011 | Tsai | H01L 21/76898 257/738 |
| 2014/0146209 | A1 * | 5/2014 | Wan | H01L 27/14887 348/296 |
| 2018/0053753 | A1 * | 2/2018 | Singh | H01L 25/50 |
| 2018/0294215 | A1 * | 10/2018 | Kawaminami | H01L 23/13 |
| 2019/0109066 | A1 * | 4/2019 | Kondo | H01L 23/49844 |
| 2019/0109117 | A1 * | 4/2019 | Fang | H01L 21/6835 |
| 2019/0326191 | A1 * | 10/2019 | Kondo | H01L 23/3737 |

FOREIGN PATENT DOCUMENTS

| | | |
|---|---|---|
| JP | 2005-57152 A | 3/2005 |
| JP | 2007-142026 A | 6/2007 |
| JP | 2010-182708 A | 8/2010 |

* cited by examiner

SEMICONDUCTOR DEVICE

This application claims priority from Japanese Patent Application No. 2018-097795 filed on May 22, 2018. The content of this application is incorporated herein by reference in its entirety.

BACKGROUND OF THE DISCLOSURE

1. Field of the Disclosure

The present disclosure relates to a semiconductor device including an interposer interposed between a semiconductor chip and a mounting substrate such that a surface of the semiconductor chip on which bumps are formed faces a surface of the mounting substrate.

2. Description of the Related Art

In the related art, this type of semiconductor device including an interposer is disclosed in, for example, Japanese Unexamined Patent Application Publication No. 2007-142026 (Patent Document 1). This semiconductor device includes semiconductor chips mounted to both surfaces of an interposer with bumps interposed therebetween. The interposer has a front groove formed on the front side thereof, a back groove formed on the back side thereof, and a through-hole formed at a predetermined position between the front and back grooves. A conductive member extends through and fills the front and back grooves and the through-hole, thereby forming a front groove wiring line on the front side of the interposer, a back groove wiring line on the back side of the interposer, and a via between the wiring lines. Each semiconductor chip includes a semiconductor substrate and a functional element formed thereon. The functional elements are bonded to the front and back groove wiring lines of the interposer by flip-chip bonding with bumps interposed therebetween such that the functional elements face the interposer, i.e., in a face-down manner.

Unfortunately, the thickness of the semiconductor device of the related art disclosed in Patent Document 1 is equal to at least the sum of the thicknesses of the semiconductor chips, the thicknesses of the bumps formed on both surfaces of the interposer, and the thickness of the interposer. This makes it difficult for the semiconductor device of the related art to have a lower profile. In addition, it is difficult for the heat generated by the functional elements formed in the semiconductor chips to escape; thus, the heat remains in the interposer between the functional elements.

BRIEF SUMMARY OF THE DISCLOSURE

According to preferred embodiments of the present disclosure, a semiconductor device includes a mounting substrate having a metal part formed in contact with an electrode pad on a surface of the mounting substrate such that the metal part protrudes from the surface of the mounting substrate; a semiconductor chip having a functional element and a bump formed in contact with an element wiring line of the functional element such that the bump protrudes from a surface of the semiconductor chip; and an interposer interposed between the semiconductor chip and the mounting substrate such that the surface of the semiconductor chip on which the bump is formed faces the surface of the mounting substrate. The interposer has a first recess formed in a surface of the interposer facing the surface of the semiconductor chip on which the bump is formed such that the first recess accommodates the bump. An interposer wiring line forming a connection between the bump and the metal part or a passive element connected to the interposer wiring line is formed in the first recess.

According to this configuration, when the semiconductor chip is mounted to the mounting substrate with the interposer interposed therebetween such that the surface on which the bump is formed faces the surface of the mounting substrate, the bump formed so as to protrude from the surface of the semiconductor chip is accommodated in the first recess formed in the surface of the interposer facing the surface of the semiconductor chip on which the bump is formed. Thus, the height at which the semiconductor chip is mounted to the surface of the mounting substrate with the interposer interposed therebetween becomes smaller by the height by which the bump is accommodated in the first recess. This allows the semiconductor device to have a lower profile and therefore a smaller size. In addition, since the semiconductor chip is attached to the interposer such that the bump is accommodated in the first recess, the semiconductor chip can be easily aligned with the interposer.

In addition, the heat generated by the operation of the functional element is transferred through the element wiring line and the bump to the thin portion of the interposer where the first recess is formed. This heat dissipates to the periphery of the interposer and also dissipates through the metal part to the mounting substrate. The thin portion of the interposer allows the heat to readily escape from that portion to the periphery of the interposer. This improves the heat dissipation performance for the heat generated by the functional element formed in the semiconductor chip and thus reduces the degradation of the element characteristics of the functional element and the likelihood of thermal runaway. In addition, the interposer has no through-hole formed therein, unlike those of semiconductor devices in the related art. Thus, the interposer is not physically damaged and maintains its mechanical strength.

Thus, preferred embodiments of the present disclosure provide a semiconductor device that has a smaller size and improved heat dissipation performance and that includes an interposer having a mechanically robust structure.

Other features, elements, characteristics and advantages of the present disclosure will become more apparent from the following detailed description of preferred embodiments of the present disclosure with reference to the attached drawings.

DETAILED DESCRIPTION OF THE DISCLOSURE

Next, semiconductor devices including interposers according to embodiments of the present disclosure will be described.

Figure 1:
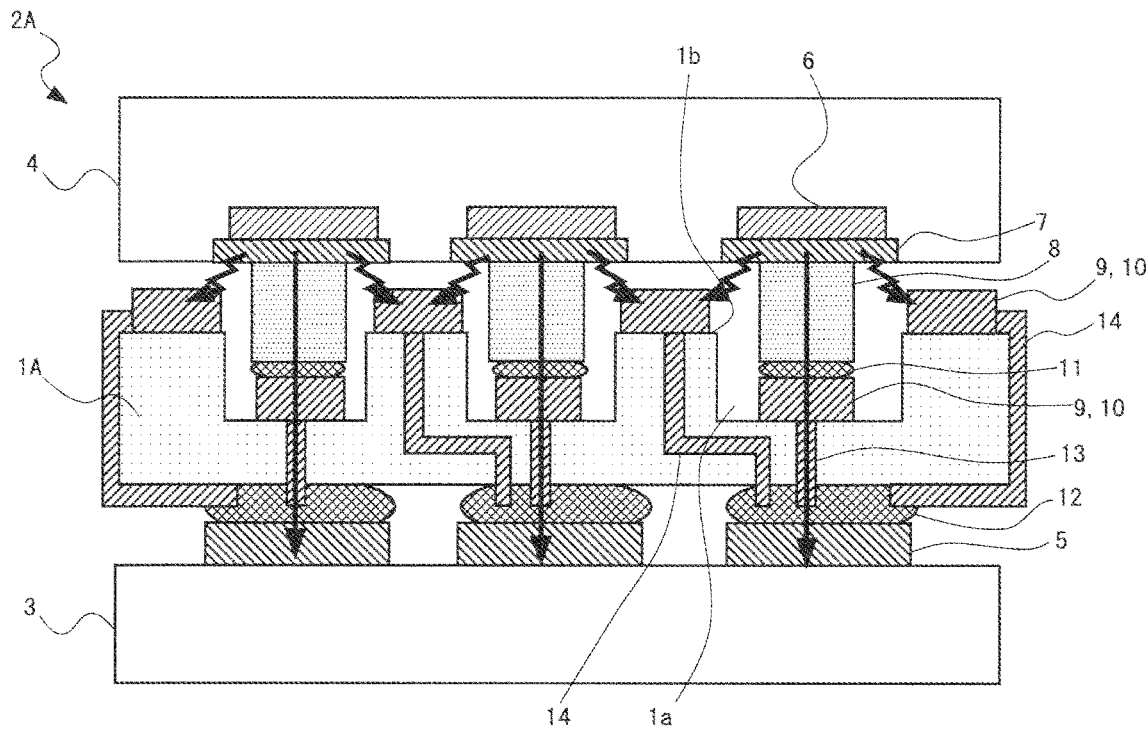
FIG. 1 is a sectional view of a semiconductor device including an interposer according to a first embodiment of the present disclosure.

FIG. 1 is a sectional view of a semiconductor device 2A including an interposer 1A according to a first embodiment of the present disclosure.

The semiconductor device 2A includes a mounting substrate 3 and a semiconductor chip 4 mounted thereto with the interposer 1A interposed therebetween. The mounting substrate 3 includes multilayer wiring and has a plurality of metal parts 5 formed as terminals on a surface of the mounting substrate 3 and in contact with electrode pads connected to the multilayer wiring. The semiconductor chip 4 has a plurality of functional elements 6 formed in an inner layer and a plurality of bumps 8 formed in contact with element wiring lines 7 of the functional elements 6 such that the bumps 8 protrude from the surface of the semiconductor chip 4. The regions where the functional elements 6 are formed partially or completely overlap with the regions where the bumps 8 are formed in the thickness direction of the semiconductor chip 4. The element wiring lines 7 are formed of a metal. The bumps 8 are pillar-shaped and are formed of a metal such as copper. The semiconductor chip 4 is mounted to the mounting substrate 3 with the interposer 1A interposed therebetween such that the surface on which the bumps 8 are formed faces the surface of the mounting substrate 3.

The interposer 1A has a plurality of first recesses 1a formed in the surface of the interposer 1A facing the surface of the semiconductor chip 4 on which the bumps 8 are formed such that the first recesses 1a accommodate only the bumps 8. Interposer wiring lines 9 forming connections between the bumps 8 and the metal parts 5 are formed in the first recesses 1a. In some cases, passive elements 10 connected to the interposer wiring lines 9 are also formed in the first recesses 1a. The interposer 1A is formed of one or more suitable materials selected from Al$_2$O$_3$, ZrO$_2$, TiO$_2$, SiO$_2$, B$_4$C, Si$_3$N$_4$, AlN, SiAlON, Si, GaN, and SiC; however, any base material may be used. Materials with low relative dielectric constants, such as SiO$_2$, have superior radio-frequency characteristics and are therefore suitable as a material for the interposer 1A used in the semiconductor device 2A for radio-frequency applications. The interposer 1A may also be formed of a ceramic such as a low-temperature co-fired ceramic (LTCC), which is formed from alumina with a glass-based material added thereto and is fired at low temperature, or a resin material, which is a low-cost material. The interposer 1A preferably has a thickness of about 100 nm to about 500 μm.

The interposer 1A has a plurality of protrusions 1b formed at positions adjacent to the first recesses 1a. The surfaces of the protrusions 1b face the surface of the semiconductor chip 4 on which the bumps 8 are formed. Other interposer wiring lines 9 or passive elements 10 connected to the interposer wiring lines 9 are disposed on the surfaces of the protrusions 1b such that the interposer wiring lines 9 or the passive elements 10 are separated from the surface on which the bumps 8 are formed. The head portions of the bumps 8 are bonded with a solder 11 to the interposer wiring lines 9 or the passive elements 10 formed in the first recesses 1a. The surface of the interposer 1A facing away from the surface on which the bumps 8 are formed is bonded with a solder 12 to the metal parts 5. The interposer wiring lines 9 or the passive elements 10 formed in the first recesses 1a are connected to the metal parts 5 through wiring lines 13 formed along the outer periphery of the interposer 1A. The interposer wiring lines 9 or the passive elements 10 disposed on the surfaces of the protrusions 1b are connected to the metal parts 5 through wiring lines 14 formed along the outer periphery of the interposer 1A and the solder 12.

Figure 2:
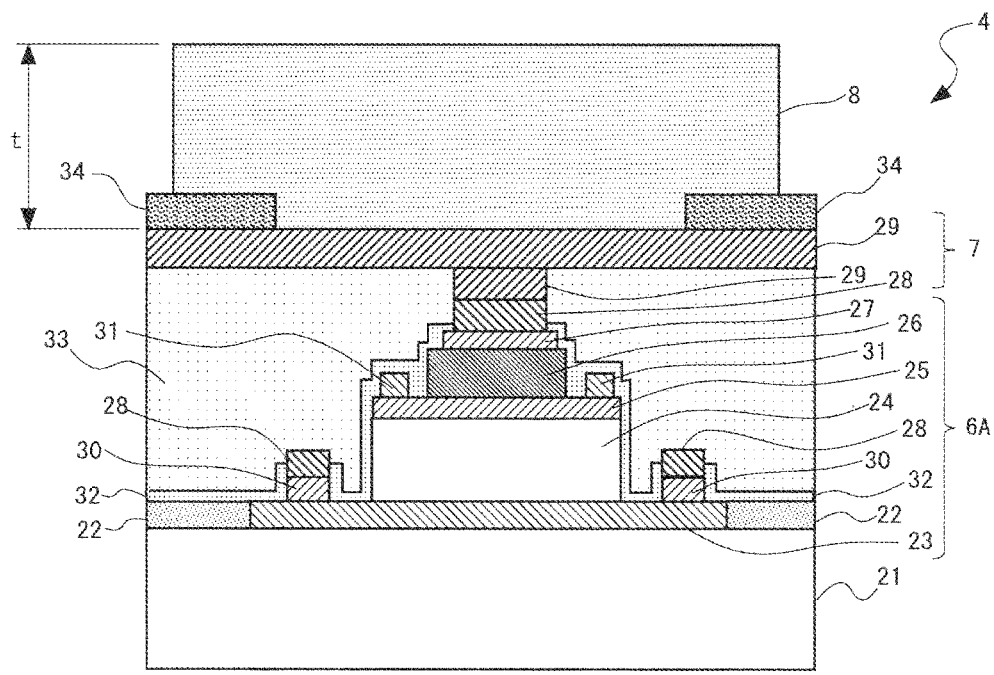
FIG. 2 is a sectional view of a heterojunction bipolar transistor formed as an example functional element in a semiconductor chip mounted to a semiconductor device according to each embodiment.

FIG. 2 is a sectional view of a heterojunction bipolar transistor (hereinafter referred to as "HBT") 6A formed as an example functional element 6 in the semiconductor chip 4. The HBT 6A is formed on a surface of a semi-insulating GaAs substrate 21 and is surrounded by isolation regions 22. The HBT 6A includes a subcollector layer 23, a collector layer 24, a base layer 25, an emitter layer 26, an emitter electrode 27, a first wiring line 28, and a second wiring line 29. The first wiring line 28 and the second wiring line 29 correspond to the element wiring lines 7 shown in FIG. 1. Collector electrodes 30 are formed on the portions of the subcollector layer 23 around the periphery of the collector layer 24 and are connected to other first wiring lines 28. Base electrodes 31 are formed on the portions of the base layer 25 around the periphery of the emitter layer 26. The periphery of the HBT 6A is covered by a first insulating film 32 and a second insulating film 33 such as SiN films. The surface of the topmost layer, i.e., the second wiring line 29, is covered by a protective insulating film 34. A bump 8 with a thickness t of about 20 μm to about 100 μm is formed on a portion of the surface of the second wiring line 29 from which the protective insulating film 34 has been removed.

For the semiconductor device 2A including the interposer 1A according to the first embodiment, when the semiconductor chip 4 is mounted to the mounting substrate 3 with the interposer 1A interposed therebetween such that the surface on which the bumps 8 are formed faces the surface of the mounting substrate 3, the bumps 8 formed so as to protrude from the surface of the semiconductor chip 4 are accommodated in the first recesses 1a formed in the surface of the interposer 1A facing the surface of the semiconductor chip 4 on which the bumps 8 are formed. Thus, the height at which the semiconductor chip 4 is mounted to the surface of the mounting substrate 3 with the interposer 1A interposed therebetween becomes smaller by the height by which the bumps 8 are accommodated in the first recesses 1a. This allows the semiconductor device 2A to have a lower profile and therefore a smaller size. In addition, since the semiconductor chip 4 is attached to the interposer 1A such that the bumps 8 are accommodated in the first recesses 1a, the semiconductor chip 4 can be easily aligned with the interposer 1A.

In addition, the heat generated by the operation of the functional elements 6 is transferred through the element wiring lines 7 and the bumps 8 to the thin portions of the interposer 1A where the first recesses 1a are formed. This heat dissipates to the periphery of the interposer 1A and also dissipates through the metal parts 5 to the mounting substrate 3. The thin portions of the interposer 1A allow the heat to readily escape from that portion to the periphery of the interposer 1A. This improves the heat dissipation performance for the heat generated by the functional elements 6 formed in the semiconductor chip 4 and thus reduces the degradation of the element characteristics of the functional elements 6 and the likelihood of thermal runaway.

In addition, the interposer 1A has no through-hole formed therein, unlike those of semiconductor devices in the related art. Thus, the interposer 1A is not physically damaged and maintains its mechanical strength. This provides a semiconductor device 2A that has a smaller size and improved heat dissipation performance and that includes an interposer 1A having a mechanically robust structure.

For the semiconductor device 2A including the interposer 1A according to the first embodiment, the heat generated by the operation of the functional elements 6 and transferred to the interposer wiring lines 9 or the passive elements 10 formed in the first recesses 1a is also transferred through the wiring lines 13 formed along the outer periphery of the interposer 1A to the metal parts 5 and thereby dissipates to the outer periphery of the interposer 1A and to the mounting substrate 3. The wiring lines 13 formed along the outer periphery of the interposer 1A are longer than those formed through the interposer 1A. Thus, much of the heat transferred to the interposer wiring lines 9 or the passive elements 10 formed in the first recesses 1a escapes over the long heat dissipation path on which the heat is transferred through the wiring lines 13 formed along the outer periphery of the interposer 1A to the metal parts 5. In this way, the heat generated by the functional elements 6 formed in the semiconductor chip 4 also dissipates from the interposer wiring lines 9 or the passive elements 10 through the wiring lines 13 formed along the outer periphery of the interposer 1A. This further improves the heat dissipation performance for the heat generated by the functional elements 6 and thus effectively reduces the degradation of the element characteristics of the functional elements 6 and the likelihood of thermal runaway.

For the semiconductor device 2A including the interposer 1A according to the first embodiment, the heat generated by the operation of the functional elements 6 is also transferred by radiation to the interposer wiring lines 9 or the passive elements 10 formed on the surfaces of the protrusions 1b of the interposer 1A such that the interposer wiring lines 9 or the passive elements 10 are separated from the surface of the semiconductor chip 4 on which the bumps 8 are formed. The heat transferred by radiation to the interposer wiring lines 9 or the passive elements 10 is transferred through the wiring lines 14 formed along the outer periphery of the interposer 1A to the metal parts 5. The wiring lines 14 formed along the outer periphery of the interposer 1A are longer than those formed through the interposer 1A. Thus, much of the heat transferred to the interposer wiring lines 9 or the passive elements 10 formed on the surfaces of the protrusions 1b escapes over the long heat dissipation path on which the heat is transferred through the wiring lines 14 formed along the outer periphery of the interposer 1A to the metal parts 5. In this way, the heat generated by the functional elements 6 formed in the semiconductor chip 4 also dissipates by radiation to the interposer wiring lines 9 or the passive elements 10 disposed on the surfaces of the protrusions 1b. This further improves the heat dissipation performance for the heat generated by the functional elements 6 and thus more effectively reduces the degradation of the element characteristics of the functional elements 6 and the likelihood of thermal runaway.

For the semiconductor device 2A including the interposer 1A according to the first embodiment, the regions where the functional elements 6 are formed partially or completely overlap with the regions where the bumps 8 are formed in the thickness direction of the semiconductor chip 4. Thus, the heat generated by the operation of the functional elements 6 is quickly transferred to the bumps 8, thus improving the heat dissipation performance.

Figure 3:
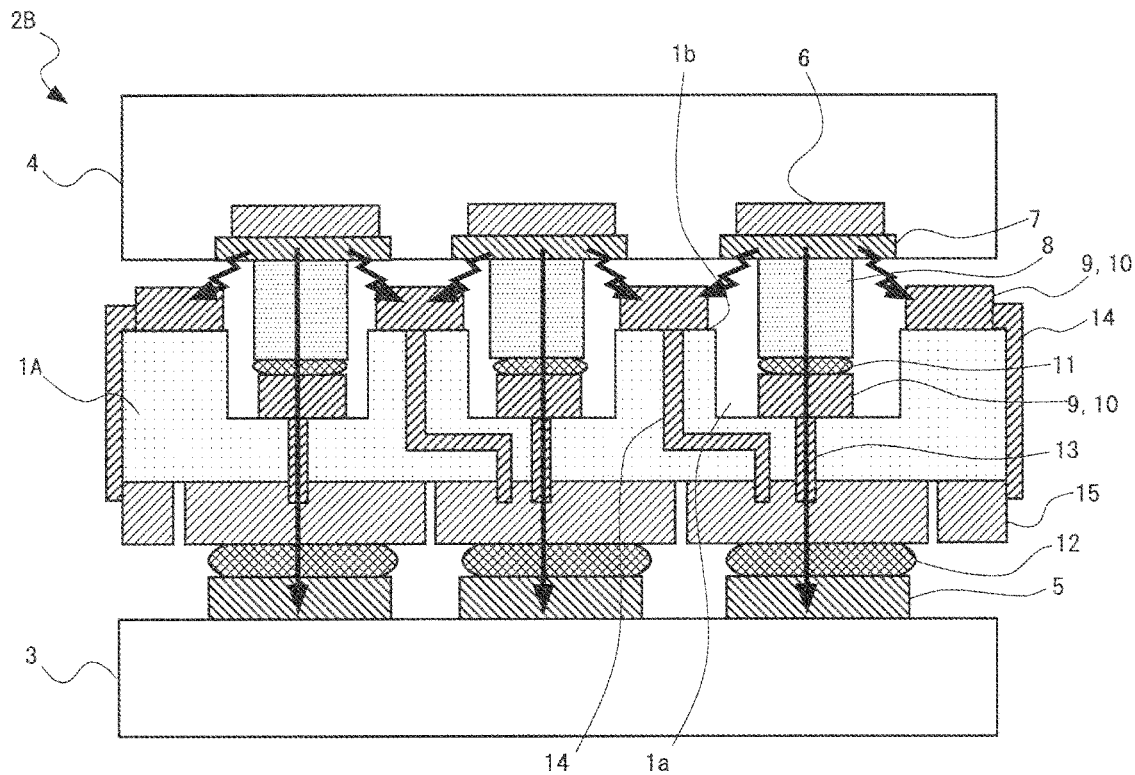
FIG. 3 is a sectional view of a semiconductor device including an interposer according to a second embodiment of the present disclosure.

FIG. 3 is a sectional view of a semiconductor device 2B including an interposer 1A according to a second embodiment of the present disclosure. In this figure, the same reference numerals are assigned to the parts identical or corresponding to those in FIG. 1, and a description thereof is omitted herein.

The semiconductor device 2B according to the second embodiment differs from the semiconductor device 2A according to the first embodiment as follows. The interposer 1A has a plurality of metal films 15, serving as terminals, formed on the surface of the interposer 1A opposite to the surface in which the first recesses 1a are formed such that the metal films 15 face the metal parts 5. The interposer 1A is bonded to the solder 12 with the metal films 15 interposed therebetween. The interposer wiring lines 9 or the passive elements 10 formed in the first recesses 1a are connected to the metal films 15 through the wiring lines 13 formed along the outer periphery of the interposer 1A. The interposer wiring lines 9 or the passive elements 10 disposed on the surfaces of the protrusions 1b are connected to the metal films 15 through the wiring lines 14 formed along the outer periphery of the interposer 1A. The remaining configuration is similar to that of the semiconductor device 2A according to the first embodiment. The metal films 15 have a higher thermal conductivity than the base material of the interposer 1A, for example, $SiO_2$.

The operation and advantages of the semiconductor device 2B according to the second embodiment are similar to those of the semiconductor device 2A according to the first embodiment. For the semiconductor device 2B according to the second embodiment, the metal films 15 formed on the interposer 1A allow more heat to dissipate from the metal films 15, which have a higher thermal conductivity than the base material of the interposer 1A, to the outer periphery of the interposer 1A, thus increasing the heat dissipation performance. In this way, the heat generated by the functional elements 6 formed in the semiconductor chip 4 dissipates efficiently from the metal films 15 formed on the surface of the interposer 1A. This improves the heat dissipation performance for the heat generated by the functional elements 6 as compared to the first embodiment and thus effectively reduces the degradation of the element characteristics of the functional elements 6 and the likelihood of thermal runaway.

For the semiconductor device 2B according to the second embodiment, the heat transferred by the radiation to the interposer wiring lines 9 or the passive elements 10 also dissipates with high heat dissipation performance from the metal films 15, which have a higher thermal conductivity than the base material of the interposer 1A, to the outer periphery of the interposer 1A. This further improves the heat dissipation performance for the heat generated by the functional elements 6 and thus more effectively reduces the degradation of the element characteristics of the functional elements 6 and the likelihood of thermal runaway.

Figure 4:
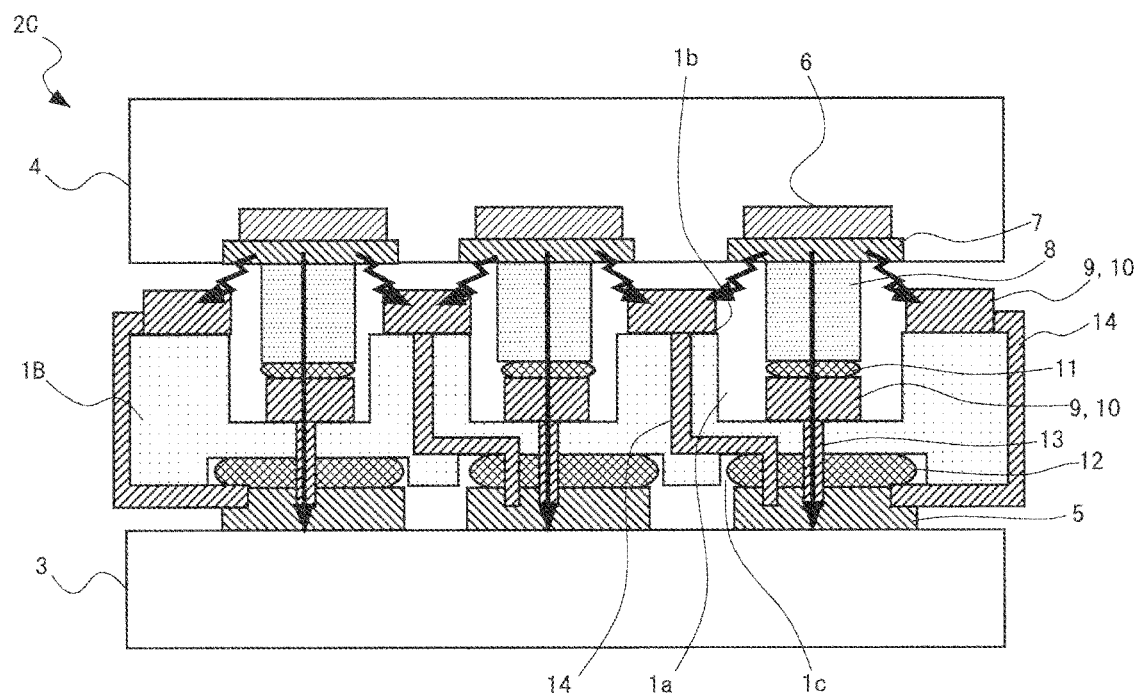
FIG. 4 is a sectional view of a semiconductor device including an interposer according to a third embodiment of the present disclosure.

FIG. 4 is a sectional view of a semiconductor device 2C including an interposer 1B according to a third embodiment of the present disclosure. In this figure, the same reference numerals are assigned to the parts identical or corresponding to those in FIG. 1, and a description thereof is omitted herein.

The semiconductor device 2C according to the third embodiment differs from the semiconductor device 2A according to the first embodiment in that the interposer 1B has second recesses 1c formed in the surface of the interposer 1B facing the surface of the mounting substrate 3 such that the second recesses 1c accommodate the metal parts 5. The remaining configuration is similar to that of the semiconductor device 2A according to the first embodiment.

The operation and advantages of the semiconductor device 2C according to the third embodiment are similar to those of the semiconductor device 2A according to the first embodiment. For the semiconductor device 2C according to the third embodiment, when the semiconductor chip 4 is mounted to the mounting substrate 3 with the interposer 1B interposed therebetween such that the surface on which the bumps 8 are formed faces the surface of the mounting substrate 3, the bumps 8 formed so as to protrude from the surface of the semiconductor chip 4 are accommodated in the first recesses 1a formed in the surface of the interposer 1B facing the surface of the semiconductor chip 4 on which the bumps 8 are formed. The metal parts 5 formed so as to protrude from the surface of the mounting substrate 3 are accommodated in the second recesses 1c formed in the surface of the interposer 1B facing the surface of the mounting substrate 3. Thus, the height at which the semiconductor chip 4 is mounted to the surface of the mounting substrate 3 with the interposer 1B interposed therebetween becomes smaller by the height by which the metal parts 5 are accommodated in the second recesses 1c in addition to the height by which the bumps 8 are accommodated in the first recesses 1a. This allows the semiconductor device 2C to have an even lower profile and therefore an even smaller size. In addition, since the interposer 1B is attached to the mounting substrate 3 such that the metal parts 5 are accommodated in the second recesses 1c, the interposer 1B can be easily aligned with the mounting substrate 3.

In addition, the portions of the interposer 1B between the first recesses 1a and the second recesses 1c are thinner than the corresponding portions of the first embodiment, thus further improving the heat dissipation performance for the heat dissipated from the thin portions of the interposer 1B. This further improves the heat dissipation performance for the heat generated by the functional elements 6 as compared to the first embodiment and thus effectively reduces the degradation of the element characteristics of the functional elements 6 and the likelihood of thermal runaway.

Figure 5:
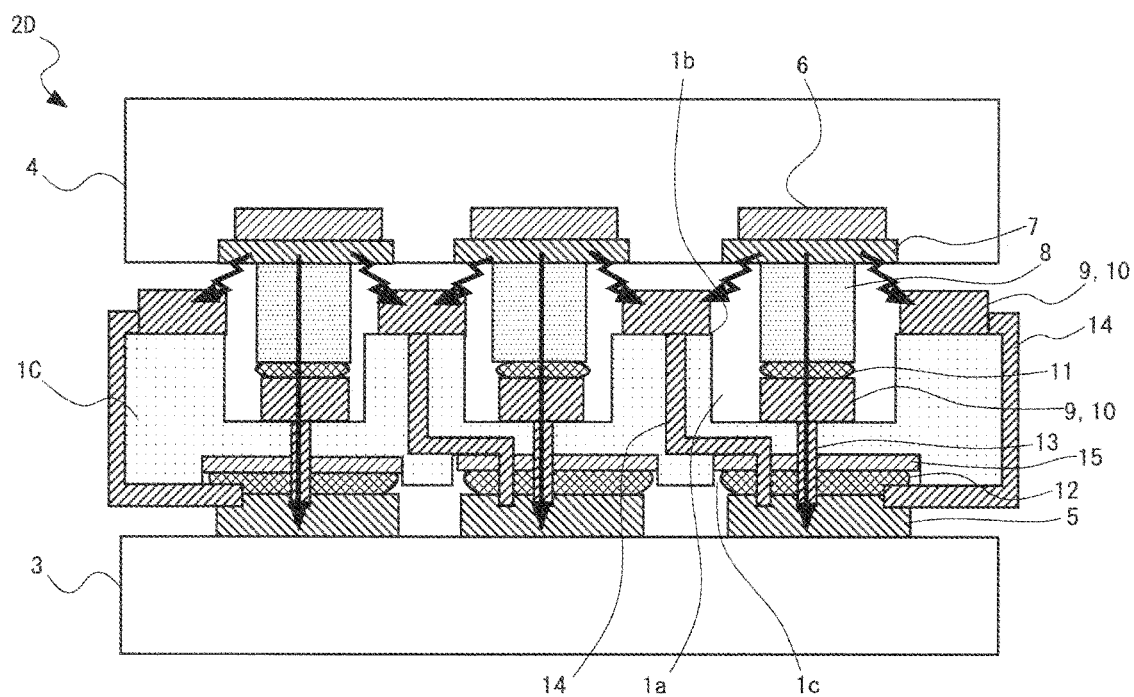
FIG. 5 is a sectional view of a semiconductor device including an interposer according to a fourth embodiment of the present disclosure.

FIG. 5 is a sectional view of a semiconductor device 2D including an interposer 1C according to a fourth embodiment of the present disclosure. In this figure, the same reference numerals are assigned to the parts identical or corresponding to those in FIG. 3, and a description thereof is omitted herein.

The semiconductor device 2D according to the fourth embodiment differs from the semiconductor device 2B according to the second embodiment in that the interposer 1C has second recesses 1c formed in the surface of the interposer 1C facing the surface of the mounting substrate 3 such that the second recesses 1c accommodate the metal films 15 and the metal parts 5. The remaining configuration is similar to that of the semiconductor device 2B according to the second embodiment.

The operation and advantages of the semiconductor device 2D according to the fourth embodiment are similar to those of the semiconductor device 2B according to the second embodiment. For the semiconductor device 2D according to the fourth embodiment, when the semiconductor chip 4 is mounted to the mounting substrate 3 with the interposer 1C interposed therebetween such that the surface on which the bumps 8 are formed faces the surface of the mounting substrate 3, the bumps 8 formed so as to protrude from the surface of the semiconductor chip 4 are accommodated in the first recesses 1a formed in the surface of the interposer 1C facing the surface of the semiconductor chip 4 on which the bumps 8 are formed. The metal films 15 and the metal parts 5 formed so as to protrude from the surface of the mounting substrate 3 are accommodated in the second recesses 1c formed in the surface of the interposer 1C facing the surface of the mounting substrate 3. Thus, the height at which the semiconductor chip 4 is mounted to the surface of the mounting substrate 3 with the interposer 1C interposed therebetween becomes smaller by the height by which the metal films 15 and the metal parts 5 are accommodated in the second recesses 1c in addition to the height by which the bumps 8 are accommodated in the first recesses 1a. This allows the semiconductor device 2D to have an even lower profile and therefore an even smaller size. In addition, since the interposer 1C is attached to the mounting substrate 3 such that the metal films 15 and the metal parts 5 are accommodated in the second recesses 1c, the interposer 1C can be easily aligned with the mounting substrate 3.

In addition, the portions of the interposer 1C between the first recesses 1a and the second recesses 1c are thinner than the corresponding portions of the second embodiment, thus further improving the heat dissipation performance for the heat dissipated from the thin portions of the interposer 1C. This further improves the heat dissipation performance for the heat generated by the functional elements 6 as compared to the second embodiment and thus effectively reduces the degradation of the element characteristics of the functional elements 6 and the likelihood of thermal runaway.

Figure 6A:
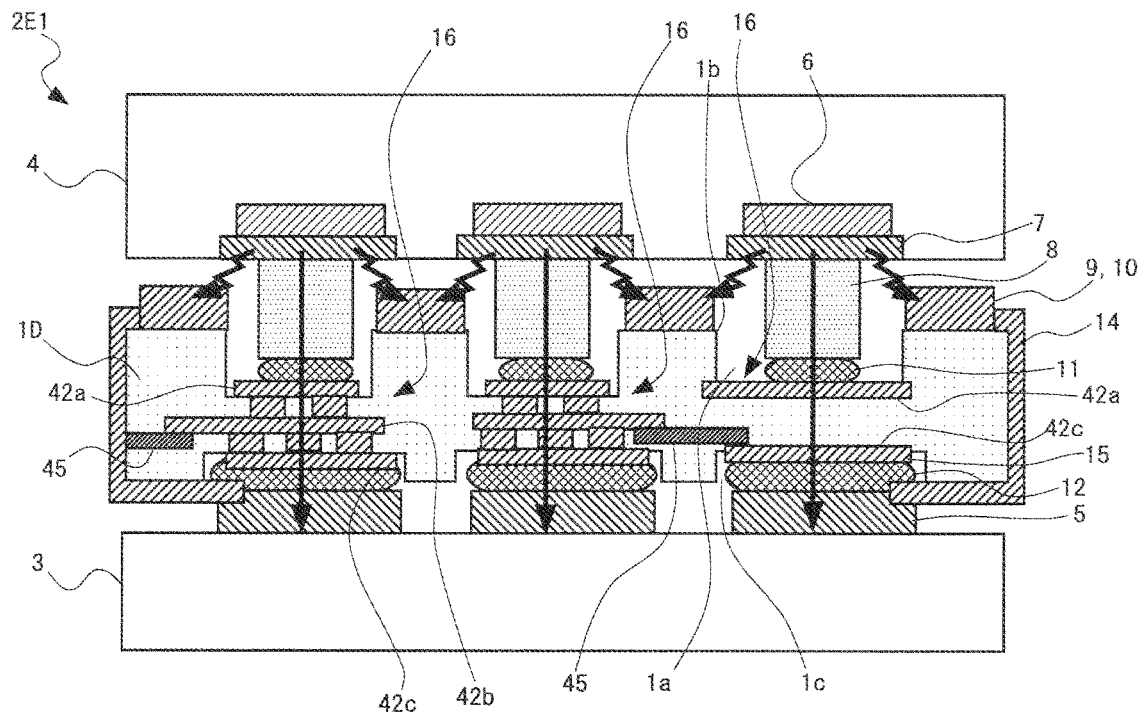
FIG. 6A is a sectional view of a semiconductor device including an interposer according to a fifth embodiment of the present disclosure.

FIG. 6A is a sectional view of a semiconductor device 2E1 including an interposer 1D according to a fifth embodiment of the present disclosure. In this figure, the same reference numerals are assigned to the parts identical or corresponding to those in FIG. 4, and a description thereof is omitted herein.

The semiconductor device 2E1 according to the fifth embodiment differs from the semiconductor device 2C according to the third embodiment in that interposer wiring lines 16 are formed in the first recesses 1a of the interposer 1D instead of the interposer wiring lines 9 or the passive elements 10. The remaining configuration is similar to that of the semiconductor device 2C according to the third embodiment. The interposer wiring lines 16 are formed between both surfaces of the portions of the interposer 1D under the bottom surfaces of the first recesses 1a, as described below, and electrically and thermally connect both surfaces of the interposer 1D.

FIGS. 7A to 7E are sectional views illustrating the first half of a process of manufacturing the interposer 1D. FIGS. 8A to 8C are sectional views illustrating the second half of the process of manufacturing the interposer 1D.

Figure 7A:
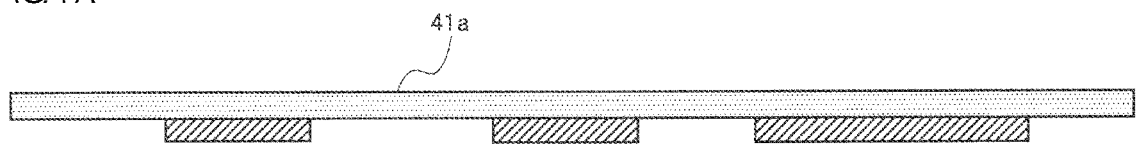
FIGS. 7A to 7E are sectional views illustrating the first half of a process of manufacturing the interposer of the semiconductor device according to the fifth embodiment.
Figure 7B:
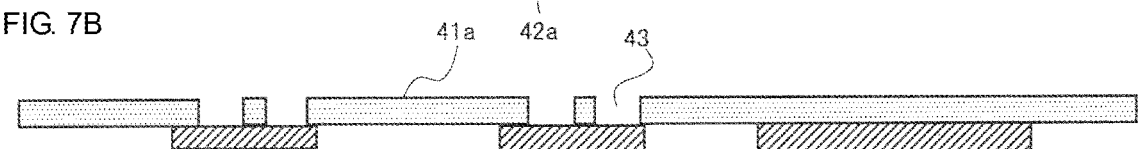
Figure 7C:
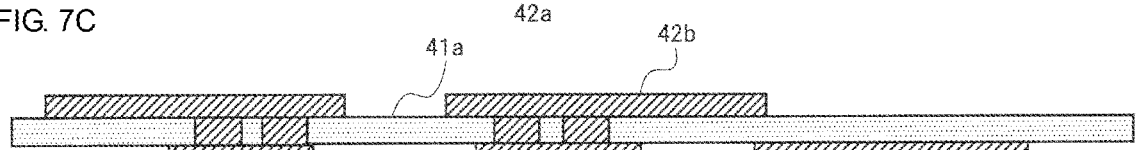
Figure 7D:
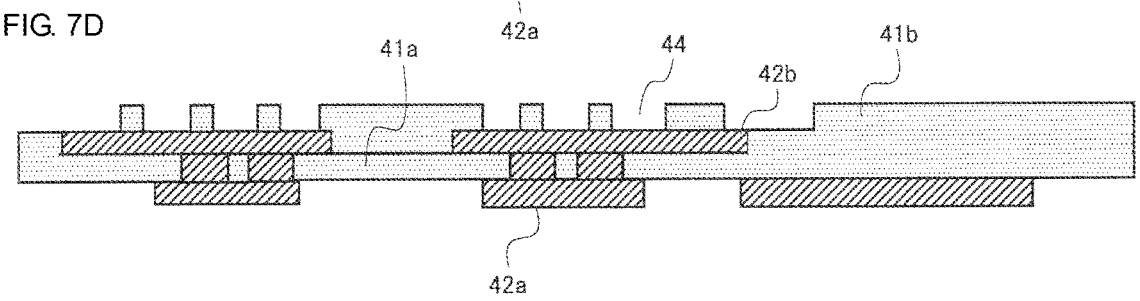
Figure 7E:
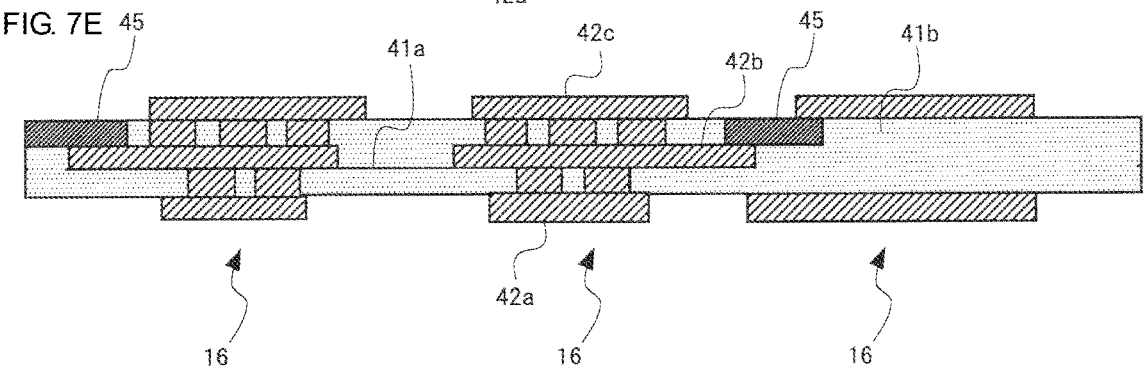
Figure 8A:
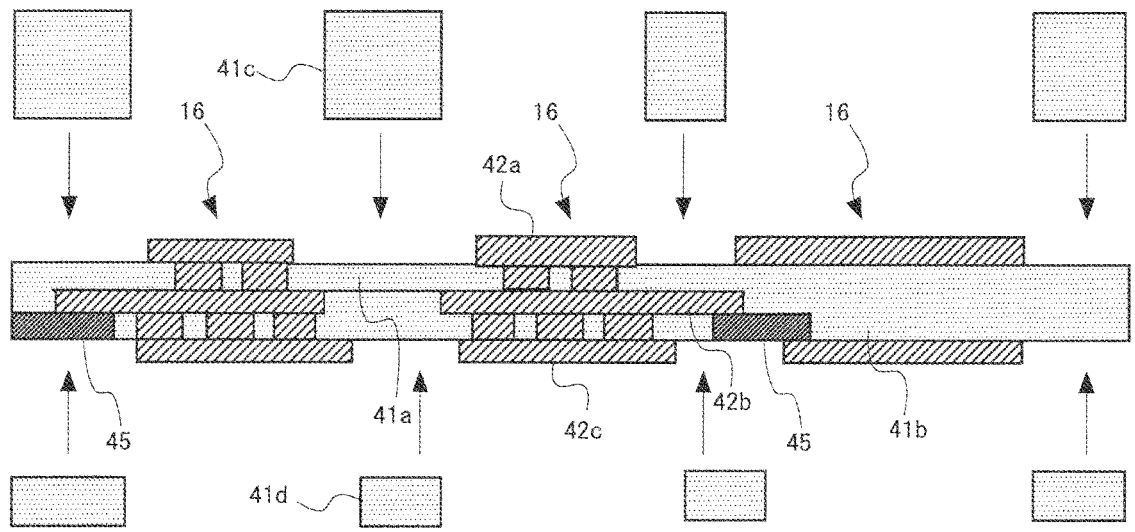
FIGS. 8A to 8C are sectional views illustrating the second half of the process of manufacturing the interposer of the semiconductor device according to the fifth embodiment.
Figure 8B:
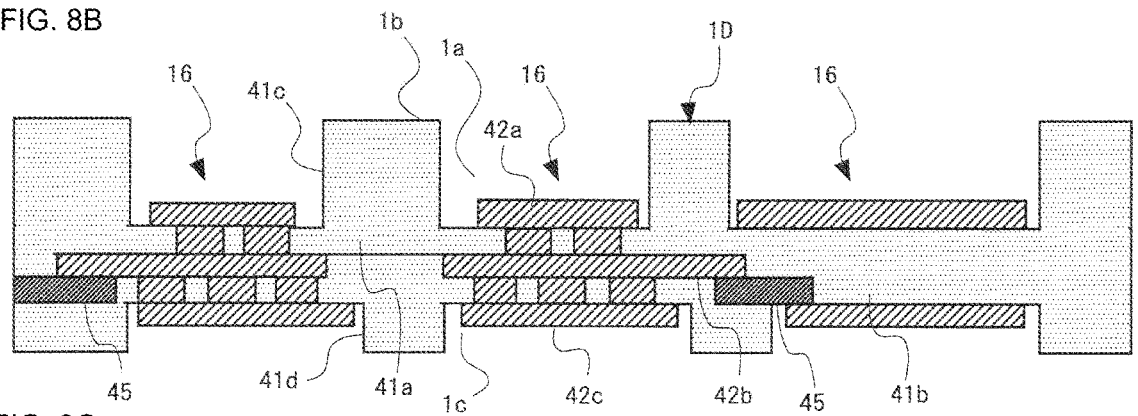
Figure 8C:
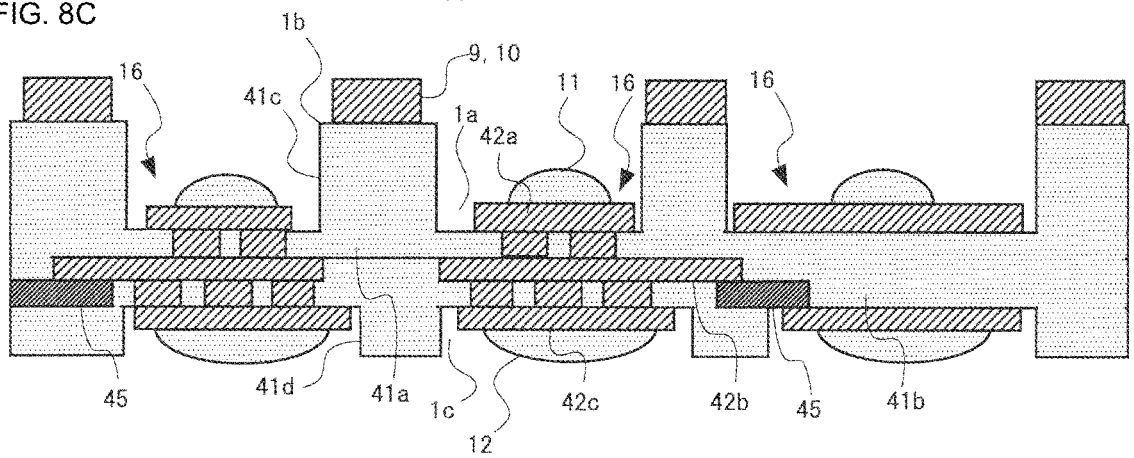

As shown in FIG. 7A, a Cu plating layer 42a is first formed in a predetermined wiring pattern on an insulator 41a, such as a resin, that becomes a part of the interposer 1D. As shown in FIG. 7B, predetermined portions of the insulator 41a are then removed to form openings 43. As shown in FIG. 7C, a Cu plating layer 42b is then formed in a predetermined wiring pattern on the surface of the insulator 41a. The Cu plating layer 42b fills the openings 43 to form vias that electrically connect the Cu plating layer 42b to the lower Cu plating layer 42a. As shown in FIG. 7D, an insulator 41b made of the same material as the insulator 41a is then formed on the Cu plating layer 42b by coating and firing. After firing, predetermined portions of the insulator 41b are removed to form openings 44. As shown in FIG. 7E, a Cu plating layer 42c is then formed in a predetermined wiring pattern on the surface of the insulator 41b. Optionally, passive elements 45 are formed so as to be embedded in the insulator 41b and in contact with the lower Cu plating layer 42b or the upper Cu plating layer 42c. The Cu plating layer 42c fills the openings 44 to form vias that electrically connect the Cu plating layer 42c to the lower Cu plating layer 42b or the passive elements 45. After these steps, the interposer wiring lines 16 and the passive elements 45 are formed by the Cu plating layers 42a to 42c.

The interposer wiring lines 16 and the passive elements 45 in the state shown in FIG. 7E are then placed upside down as shown in FIG. 8A. An insulator 41c having openings and made of the same material as the insulator 41a is laminated and fired on the top side. An insulator 41d having openings and made of the same material as the insulator 41a is laminated and fired on the bottom side. As a result, the interposer 1D in the state shown in FIG. 8B is formed by the insulators 41a to 41d, with the interposer wiring lines 16 extending between both surfaces of the interposer 1D. As shown in FIG. 8C, the interposer wiring lines 9 or the passive elements 10 are then formed on the surfaces of the protrusions 1b of the interposer 1D by Cu plating. The solder 11 is applied to the Cu plating layer 42a that forms the highest layer of the interposer wiring lines 16. The solder 12 is applied to the Cu plating layer 42c that forms the lowest layer of the interposer wiring lines 16. The interposer wiring lines 9 and 16 may not necessarily be formed by Cu plating, but may instead be formed from other conductive materials.

Subsequently, as shown in FIG. 6A, the semiconductor chip 4 is attached to the interposer 1D by bonding the bumps 8 to the solder 11, and the interposer 1D is attached to the mounting substrate 3 by bonding the metal parts 5 to the solder 12. The semiconductor device 2E1 having the structure shown in FIG. 6A is finished.

The operation and advantages of the semiconductor device 2E1 according to the fifth embodiment are similar to those of the semiconductor device 2C according to the third embodiment. For the semiconductor device 2E1 according to the fifth embodiment, the bumps 8 on the semiconductor chip 4 can be connected to the metal parts 5 on the surface of the mounting substrate 3 at the shorter distance through the interposer wiring lines 16. The passive elements 45, such as capacitors and inductors, formed on the interposer wiring lines 16 can also be connected to the bumps 8 at a shorter distance. This improves the heat dissipation performance for the heat generated by the functional elements 6 and dissipated to the mounting substrate 3 and also reduces the parasitic inductance and resistance of the interposer wiring lines 16, thus improving the characteristics, such as radio-frequency characteristics, of the semiconductor device 2E1.

The semiconductor device 2E1 according to the fifth embodiment may not necessarily have the second recesses 1c. Although the operation and advantages specific to the second recesses 1c are not provided, the foregoing operation and advantages specific to the interposer wiring lines 16 of the semiconductor device 2E1 according to the fifth embodiment are provided.

Although the wiring lines 13 formed along the outer periphery of the interposer 1D to form connections between the Cu plating layer 42a forming the interposer wiring lines 16 immediately under the solder 11 and the metal parts 5 are not shown, the semiconductor device 2E1 according to the fifth embodiment may have the wiring lines 13. This further improves the heat dissipation performance for the heat generated by the functional elements 6.

Figure 6B:
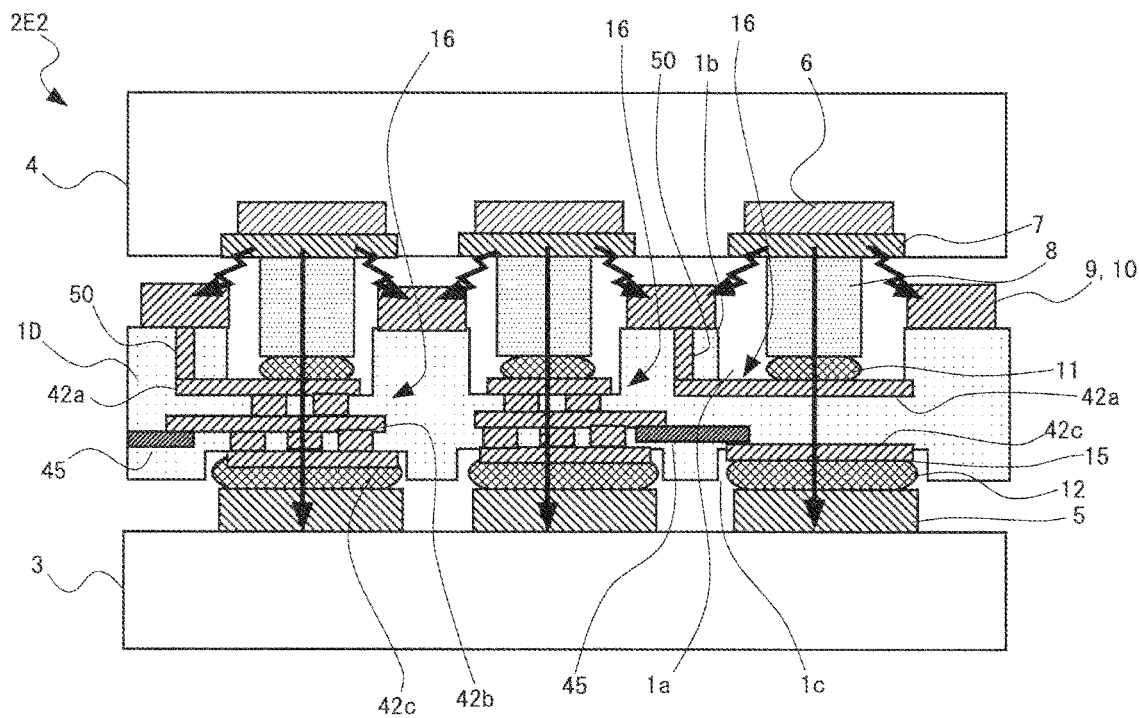
FIG. 6B is a sectional view of a semiconductor device including an interposer according to a modification of the fifth embodiment.

Although the semiconductor device 2E1 according to the fifth embodiment has the wiring lines 14 formed along the outer periphery of the interposer 1D, the semiconductor device 2E1 may be modified into a semiconductor device 2E2 having the structure shown in FIG. 6B, which lacks the wiring lines 14. The semiconductor device 2E2 according to the modification of the fifth embodiment lacks the wiring lines 14; instead, vias 50 made of a metal such as Cu are formed through the protrusions 1b of the interposer 1D to the Cu plating layer 42a. The lack of the wiring lines 14 poses no problem since, whereas some of the heat generated by the functional elements 6 is dissipated through the vias 50, most of the heat is dissipated from the bumps 8 to the mounting substrate 3 through the metal parts that form the wiring lines 16 formed in the first recesses 1a so as to extend through the interposer 1D.

For the semiconductor device 2E1 according to the fifth embodiment, as shown in FIG. 8A, the interposer 1D is formed by laminating the insulators 41c and 41d to the insulators 41a and 41b. In contrast, for the semiconductor device 2E2 according to the modification of the fifth embodiment, the insulator 41c is formed on the insulator 41a by coating and firing, as in the step of forming the insulator 41b on the insulator 41a in FIGS. 7C and 7D. Openings for the vias 50 are formed in the insulator 41c and are filled with a metal for the vias 50, and the wiring lines 9 or the passive elements 10 are formed on the protrusions 1b. The first recesses 1a are formed by openings in the insulator 41c. The insulator 41d and the second recesses 1c are formed in the same manner as above. The semiconductor device 2E2 according to the modification of the fifth embodiment does not require the wiring lines 14 to be formed along the outer periphery of the interposer 1D, which reduces the manufacturing cost of the semiconductor device 2E2.

Figure 9:
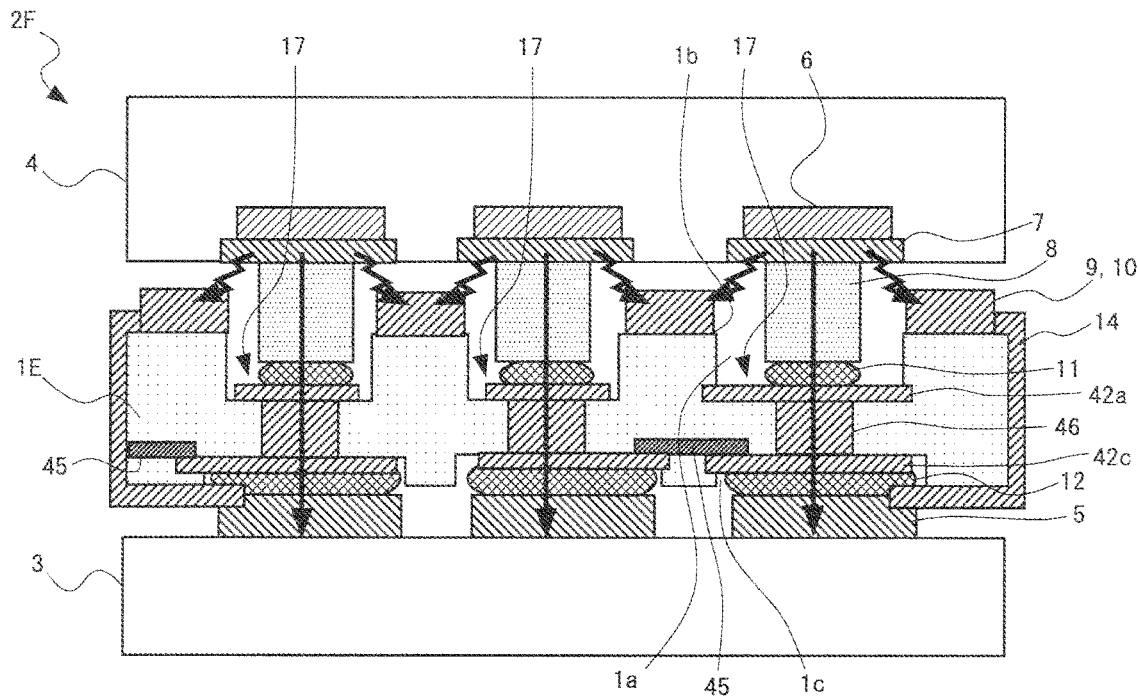
FIG. 9 is a sectional view of a semiconductor device including an interposer according to a sixth embodiment of the present disclosure.

FIG. 9 is a sectional view of a semiconductor device 2F including an interposer 1E according to a sixth embodiment of the present disclosure. In this figure, the same reference numerals are assigned to the parts identical or corresponding to those in FIG. 6A, and a description thereof is omitted herein.

The semiconductor device 2F according to the sixth embodiment differs from the semiconductor device 2E1 according to the fifth embodiment only in that the interposer wiring lines 16 are replaced by interposer wiring lines 17 having vias 46 serving as conductive paths extending through the portions of the interposer 1E under the bottom surfaces of the first recesses 1a. The remaining configuration is similar to that of the semiconductor device 2E1 according to the fifth embodiment. The interposer wiring lines 17 electrically and thermally connect both surfaces of the interposer 1E, as do the interposer wiring lines 16.

Although the interposer 1E has through-holes formed therein and thus exhibits decreased mechanical strength, the operation and advantages of the semiconductor device 2F according to the sixth embodiment are similar to those of the semiconductor device 2C according to the third embodiment. For the semiconductor device 2F according to the sixth embodiment, as with the semiconductor device 2E1 according to the fifth embodiment, the bumps 8 on the semiconductor chip 4 can be connected to the metal parts 5 on the surface of the mounting substrate 3 at a shorter distance through the interposer wiring lines 17. In addition, the bumps 8 can be connected to the metal parts 5 on the surface of the mounting substrate 3 over a larger cross-sectional area. The passive elements 45, such as capacitors and inductors, formed on the interposer wiring lines 17 can also be connected to the bumps 8 at a shorter distance. This improves the heat dissipation performance for the heat generated by the functional elements 6 and dissipated to the mounting substrate 3 of the semiconductor device 2F according to the sixth embodiment and also reduces the parasitic inductance and resistance of the interposer wiring lines 17, thus improving the radio-frequency characteristics of the semiconductor device 2F.

The semiconductor device 2F according to the sixth embodiment may not necessarily have the second recesses 1c. Although the operation and advantages specific to the second recesses 1c are not provided, the foregoing operation and advantages specific to the interposer wiring lines 17 of the semiconductor device 2F according to the sixth embodiment are provided.

Although the wiring lines 13 formed along the outer periphery of the interposer 1E to form connections between the Cu plating layer 42a forming the interposer wiring lines 17 immediately under the solder 11 and the metal parts 5 are not shown, the semiconductor device 2F according to the sixth embodiment may have the wiring lines 13. This further improves the heat dissipation performance for the heat generated by the functional elements 6. As with the semiconductor device 2E2 according to the modification of the fifth embodiment, the semiconductor device 2F according to the sixth embodiment may lack the wiring lines 14 formed along the outer periphery of the interposer 1E, which reduces the manufacturing cost of the semiconductor device 2F.

Figure 10:
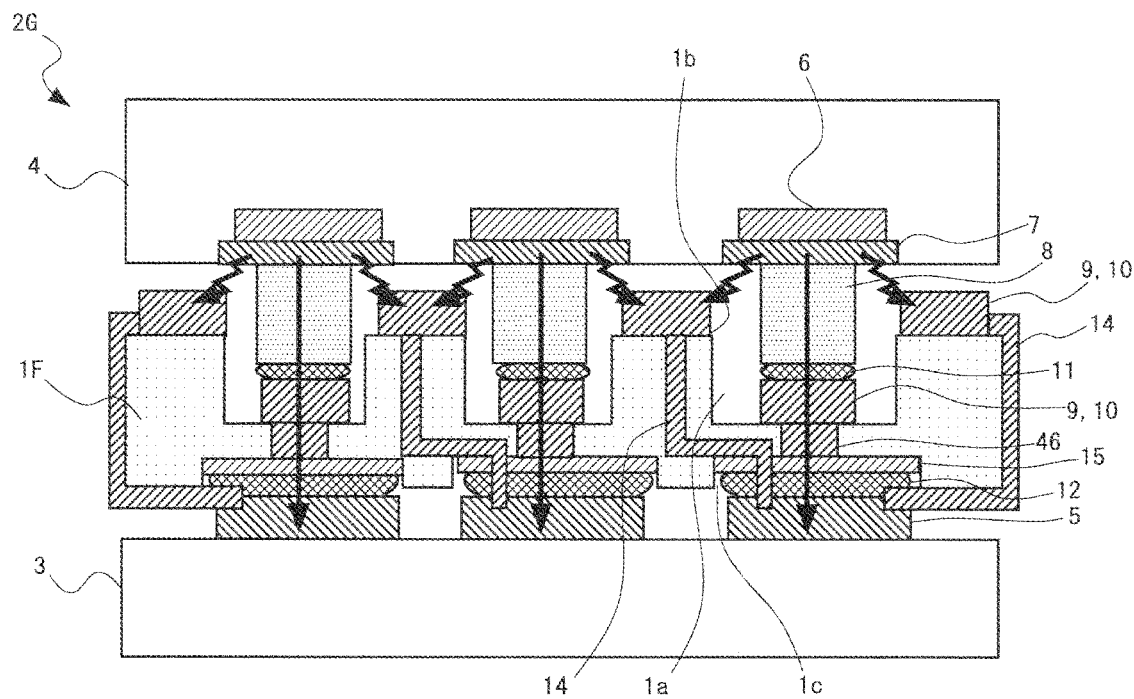
FIG. 10 is a sectional view of a semiconductor device including an interposer according to a seventh embodiment of the present disclosure.

FIG. 10 is a sectional view of a semiconductor device 2G including an interposer 1F according to a seventh embodiment of the present disclosure. In this figure, the same reference numerals are assigned to the parts identical or corresponding to those in FIG. 5, and a description thereof is omitted herein.

The semiconductor device 2G according to the seventh embodiment differs from the semiconductor device 2D according to the fourth embodiment only in that the interposer wiring lines 9 have vias 46 serving as conductive paths extending through the portions of the interposer 1F under the bottom surfaces of the first recesses 1a. The remaining configuration is similar to that of the semiconductor device 2D according to the fourth embodiment.

Although the interposer 1F has through-holes formed therein and thus exhibits decreased mechanical strength, the operation and advantages of the semiconductor device 2G according to the seventh embodiment are similar to those of the semiconductor device 2D according to the fourth embodiment. For the semiconductor device 2G according to the seventh embodiment, as with the semiconductor device 2F according to the sixth embodiment, the bumps 8 on the semiconductor chip 4 can be connected to the metal parts 5 on the surface of the mounting substrate 3 at a shorter distance through the interposer wiring lines 9. In addition, the bumps 8 can be connected to the metal parts 5 on the surface of the mounting substrate 3 over a larger cross-sectional area. This improves the heat dissipation performance for the heat generated by the functional elements 6 and dissipated to the mounting substrate 3 of the semiconductor device 2G according to the seventh embodiment and also reduces the parasitic inductance and resistance of the interposer wiring lines 9, thus improving the radio-frequency characteristics of the semiconductor device 2G.

Figure 11:
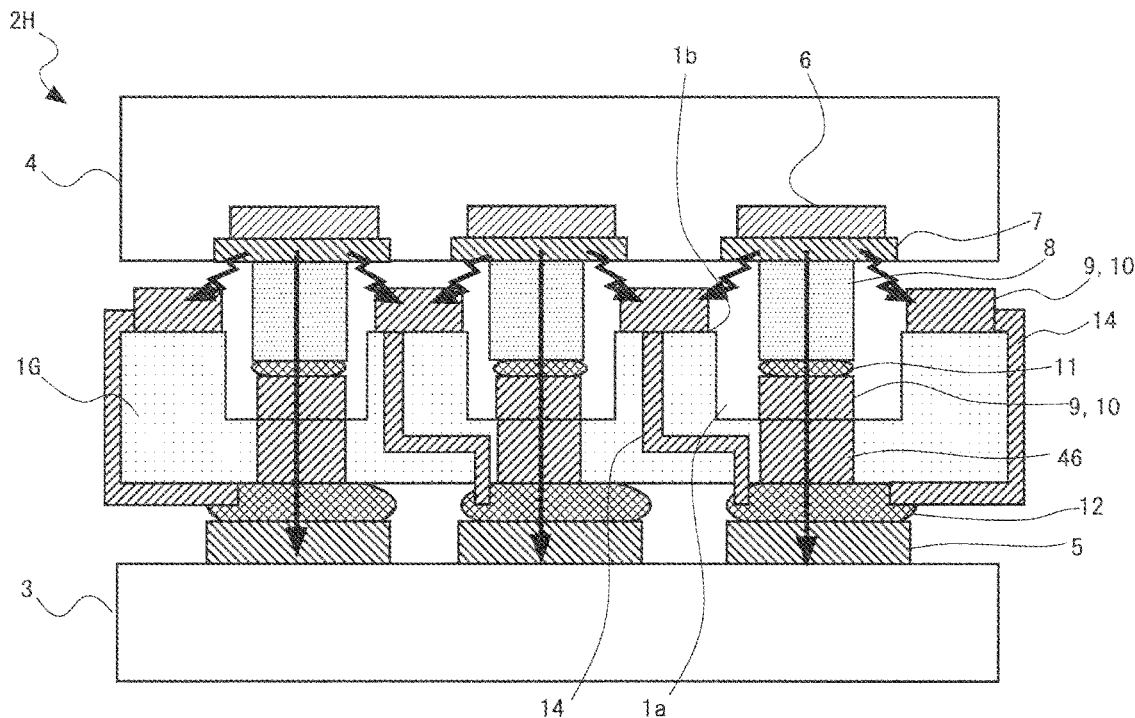
FIG. 11 is a sectional view of a semiconductor device including an interposer according to an eighth embodiment of the present disclosure.

FIG. 11 is a sectional view of a semiconductor device 2H including an interposer 1G according to an eighth embodiment of the present disclosure. In this figure, the same reference numerals are assigned to the parts identical or corresponding to those in FIG. 10, and a description thereof is omitted herein.

The semiconductor device 2H according to the eighth embodiment differs from the semiconductor device 2G according to the seventh embodiment only in that the semiconductor device 2H does not have the metal films 15 or the second recesses 1c. The remaining configuration is similar to that of the semiconductor device 2G according to the seventh embodiment.

Although the operation and advantages specific to the metal films 15 and the second recesses 1c are not provided, the remaining operation and advantages of the semiconductor device 2H according to the eighth embodiment are similar to those of the semiconductor device 2G according to the seventh embodiment.

Figure 12:
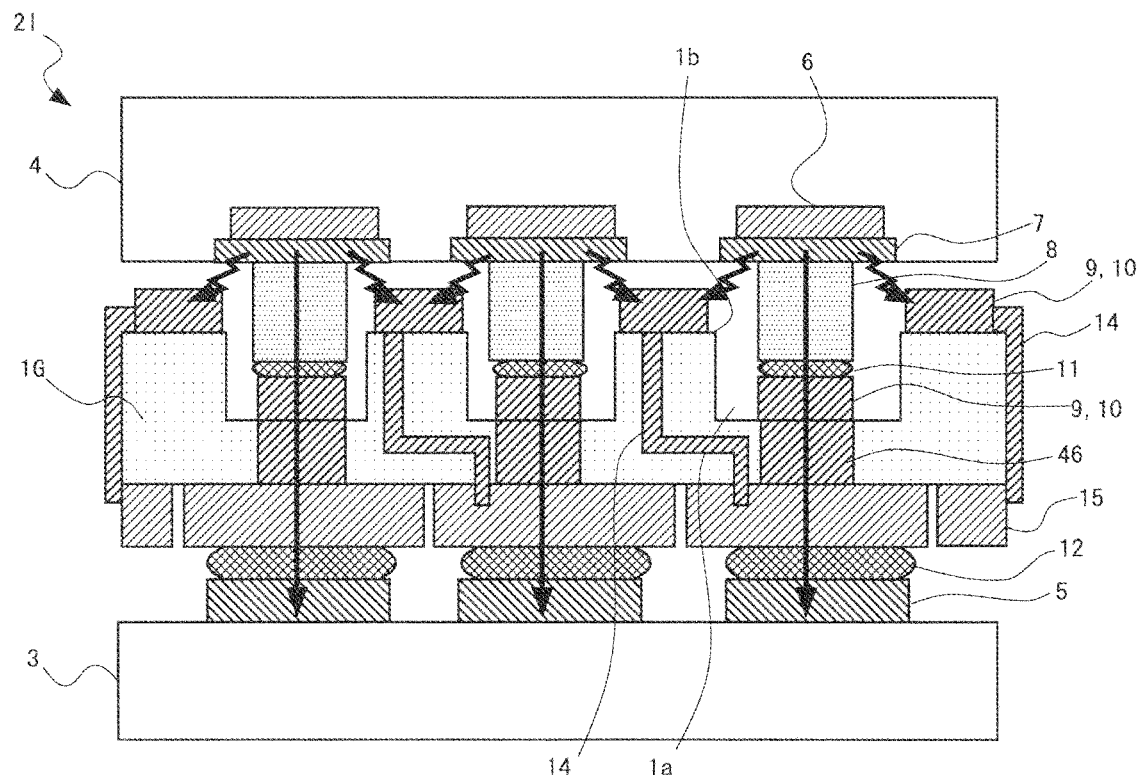
FIG. 12 is a sectional view of a semiconductor device including an interposer according to a ninth embodiment of the present disclosure.

FIG. 12 is a sectional view of a semiconductor device 2I including an interposer 1G according to a ninth embodiment of the present disclosure. In this figure, the same reference numerals are assigned to the parts identical or corresponding to those in FIG. 10, and a description thereof is omitted herein.

The semiconductor device 2I according to the ninth embodiment differs from the semiconductor device 2G according to the seventh embodiment only in that the semiconductor device 2I does not have the second recesses 1c. The remaining configuration is similar to that of the semiconductor device 2G according to the seventh embodiment.

Although the operation and advantages specific to the second recesses 1c are not provided, the remaining operation and advantages of the semiconductor device 2I according to the ninth embodiment are similar to those of the semiconductor device 2G according to the seventh embodiment.

Although the wiring lines 13 formed along the outer periphery of the interposers 1F and 1G to form connections between the interposer wiring lines 9 immediately under the solder 11 and the metal parts 5 are not shown, the semiconductor devices 2G, 2H, and 2I according to the seventh, eighth, and ninth embodiments may have the wiring lines 13. This further improves the heat dissipation performance for the heat generated by the functional elements 6.

Although the semiconductor chips 4 of the semiconductor devices 2A to 2I according to the foregoing embodiments have been described by way of example as including the HBTs 6A as the functional elements 6, the functional elements 6 are not limited to the HBTs 6A. Similar operation and advantages can be provided for other functional elements such as field-effect transistors and unipolar transistors. The present disclosure is particularly effective for semiconductor chips 4 including functional elements 6 that generate large amounts of heat and allows the semiconductor devices 2A to 2I to have a lower profile while reducing the degradation of the characteristics of the functional elements 6 due to heat and the likelihood of thermal runaway.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A semiconductor device comprising:
a mounting substrate having a metal part provided in contact with an electrode pad on a surface of the mounting substrate such that the metal part protrudes from the surface of the mounting substrate;
a semiconductor chip having a functional element and a bump provided in contact with an element wiring line of the functional element such that the bump protrudes from a surface of the semiconductor chip; and
an interposer interposed between the semiconductor chip and the mounting substrate such that the surface of the semiconductor chip having the bump provided thereon faces the surface of the mounting substrate,
wherein the interposer has a first recess provided in a surface of the interposer facing the surface of the semiconductor chip having the bump provided thereon such that the first recess accommodates the bump, and
wherein an interposer wiring line providing a connection between the bump protruded into the first recess and the metal part or a passive element disposed on the metal part is provided in the first recess,
wherein a second interposer wiring line connected to the metal part is disposed on a top of the first recess, such that the second interposer wiring line receives heat from the functional element and transmits the heat to the metal part.

2. The semiconductor device according to claim 1, wherein the interposer wiring line or the passive element provided in the first recess is connected to the metal part through a wiring line provided along an outer periphery of the interposer.

3. The semiconductor device according to claim 2, wherein
the interposer wiring line or the passive element connected to the interposer wiring line is disposed on a surface of a protrusion of the interposer facing the surface of the semiconductor chip having the bump provided thereon such that the interposer wiring line or the passive element is separated from the surface having the bump provided thereon, and
the interposer wiring line or the passive element disposed on the surface of the protrusion is connected to the metal part through a wiring line formed along an outer periphery of the interposer.

4. The semiconductor device according to claim 2, wherein
the interposer has a metal film provided on a surface of the interposer opposite to the surface having the first recess provided therein such that the metal film faces the metal part,
the interposer wiring line or the passive element connected to the interposer wiring line is disposed on a surface of a protrusion of the interposer facing the surface of the semiconductor chip having the bump provided thereon such that the interposer wiring line or the passive element is separated from the surface on which the bump is formed, and
the interposer wiring line or the passive element disposed on the surface of the protrusion is connected to the metal film through a wiring line provided along an outer periphery of the interposer.

5. The semiconductor device according to claim 2, wherein the interposer has a second recess provided in a surface of the interposer facing the surface of the mounting substrate such that the second recess accommodates the metal part.

6. The semiconductor device according to claim 2, wherein the interposer wiring line provided in the first recess extends between both surfaces of a portion of the interposer under a bottom surface of the first recess.

7. The semiconductor device according to claim 1, wherein
the interposer wiring line or the passive element connected to the interposer wiring line is disposed on a surface of a protrusion of the interposer facing the surface of the semiconductor chip having the bump provided thereon such that the interposer wiring line or the passive element is separated from the surface having the bump provided thereon, and
the interposer wiring line or the passive element disposed on the surface of the protrusion is connected to the metal part through a wiring line formed along an outer periphery of the interposer.

8. The semiconductor device according to claim 7, wherein
the interposer has a metal film provided on a surface of the interposer opposite to the surface having the first recess provided therein such that the metal film faces the metal part,
an interposer wiring line or a passive element connected to the interposer wiring line is disposed on a surface of a protrusion of the interposer facing the surface of the semiconductor chip having the bump provided thereon such that the interposer wiring line or the passive element is separated from the surface on which the bump is formed, and
the interposer wiring line or the passive element disposed on the surface of the protrusion is connected to the metal film through a wiring line provided along an outer periphery of the interposer.

9. The semiconductor device according to claim 7, wherein the interposer has a second recess provided in a surface of the interposer facing the surface of the mounting substrate such that the second recess accommodates the metal part.

10. The semiconductor device according to claim 7, wherein the interposer wiring line provided in the first recess extends between both surfaces of a portion of the interposer under a bottom surface of the first recess.

11. The semiconductor device according to claim 1, wherein
the interposer has a metal film provided on a surface of the interposer opposite to the surface having the first recess provided therein such that the metal film faces the metal part, and
the interposer wiring line or the passive element formed in the first recess is connected to the metal film through a wiring line formed along an outer periphery of the interposer.

12. The semiconductor device according to claim 11, wherein the interposer has a second recess provided in a surface of the interposer facing the surface of the mounting substrate such that the second recess accommodates the metal film and the metal part.

13. The semiconductor device according to claim 11, wherein the interposer has a metal film provided on a surface of the interposer opposite to the surface having the first recess provided therein such that the metal film faces the metal part, the interposer wiring line or the passive element connected to the interposer wiring line is disposed on a surface of a protrusion of the interposer facing the surface of the semiconductor chip having the bump provided thereon such that the interposer wiring line or the passive element is separated from the surface on which the bump is formed, and the interposer wiring line or the passive element disposed on the surface of the protrusion is connected to the metal film through a wiring line provided along an outer periphery of the interposer.

14. The semiconductor device according to claim 1, wherein the interposer has a metal film provided on a surface of the interposer opposite to the surface having the first recess provided therein such that the metal film faces the metal part, the interposer wiring line or the passive element connected to the interposer wiring line is disposed on a surface of a protrusion of the interposer facing the surface of the semiconductor chip having the bump provided thereon such that the interposer wiring line or the passive element is separated from the surface on which the bump is formed, and the interposer wiring line or the passive element disposed on the surface of the protrusion is connected to the metal film through a wiring line provided along an outer periphery of the interposer.

15. The semiconductor device according to claim 14, wherein the interposer has a second recess provided in a surface of the interposer facing the surface of the mounting substrate such that the second recess accommodates the metal film and the metal part.

16. The semiconductor device according to claim 1, wherein the interposer has a second recess provided in a surface of the interposer facing the surface of the mounting substrate such that the second recess accommodates the metal part.

17. The semiconductor device according to claim 1, wherein the interposer wiring line provided in the first recess extends between both surfaces of a portion of the interposer under a bottom surface of the first recess.

18. The semiconductor device according to claim 1, wherein the interposer wiring line provided in the first recess has a conductive path extending through a portion of the interposer under a bottom surface of the first recess.

19. The semiconductor device according to claim 1, wherein a region having the functional element provided partially or completely overlaps with a region having the bump provided in a thickness direction of the semiconductor chip.

20. The semiconductor device according to claim 1, wherein the functional element is a heterojunction bipolar transistor.

* * * * *